United States Patent
Dai et al.

(10) Patent No.: US 6,174,781 B1
(45) Date of Patent: Jan. 16, 2001

(54) DUAL DAMASCENE PROCESS FOR CAPACITANCE FABRICATION OF DRAM

(75) Inventors: Chang-Ming Dai; Meng-Jaw Cherng, both of Hsinchu Hsien (TW)

(73) Assignee: Worldwide Semiconductor Manufacturing Corp., Hsinchu (TW)

( * ) Notice: Under 35 U.S.C. 154(b), the term of this patent shall be extended for 0 days.

(21) Appl. No.: 09/342,569

(22) Filed: Jun. 29, 1999

(30) Foreign Application Priority Data

Apr. 26, 1999 (TW) ............................................ 99/88106625

(51) Int. Cl.⁷ ........................................................ H01L 21/20
(52) U.S. Cl. .......................... 438/396; 438/253; 438/255; 438/398; 438/725
(58) Field of Search .................................... 257/300, 303, 257/304, 306, 532; 438/396, 397, 398, 399, 393, 253, 254, 255, 256, 259, 239, 387, 637, 638, 667, 668, 672, 674, 675, 725

(56) References Cited

U.S. PATENT DOCUMENTS 5,702,982 * 12/1997 Lee et al. .............................. 438/620
5,759,888 * 6/1998 Wang et al. .......................... 438/239
5,827,766 * 10/1998 Lou ....................................... 438/253
5,856,220 * 1/1999 Wang et al. .......................... 438/254
5,956,587 * 9/1999 Chen et al. ........................... 438/255

* cited by examiner

Primary Examiner—Olik Chaudhuri
Assistant Examiner—Hoai Pham
(74) Attorney, Agent, or Firm—J. C. Patents; Jiawei Huang

(57) ABSTRACT

A method of fabricating a capacitor is described in which a substrate comprises a transistor and a planarized insulation layer. An opening is formed in the insulation layer, exposing one of the source/drain of the transistor. A sacrificial plug is formed in the first opening. The insulation layer surrounding the first opening is removed to form a second opening and a certain thickness of the insulation layer is retained at the bottom of the second opening. The sacrificial plug is removed and simultaneously forming a node plug and a first electrode respectively in the first opening and on the bottom and side wall of the second opening. A dielectric layer is further formed on the surface of the first electrode and a second electrode is formed on the dielectric layer.

6 Claims, 2 Drawing Sheets

DUAL DAMASCENE PROCESS FOR CAPACITANCE FABRICATION OF DRAM

CROSS-REFERENCE TO RELATED APPLICATION

This application claims the priority benefit of Taiwan application serial no. 88106625, filed Apr. 26, 1999, the full disclosure of which is incorporated herein by reference.

BACKGROUND OF THE INVENTION

1. Field of the Invention

The present invention relates to a fabrication method of a semiconductor device. More particularly, the present invention relates to a fabrication method of a capacitor for a dynamic random access memory (DRAM) cell.

2. Description of the Related Art

According to the conventional manufacturing method of a DRAM capacitor, a first insulation layer is formed on a substrate that contains at least a transistor, followed by the formation of a first node contact plug and a bit line. A second insulation layer is further formed and is defined to form a first opening, exposing the note contact plug. A node plug is formed by filling the first opening with a conductive material. After which, a third insulation layer is formed, centering at the first opening, and is defined to form a second opening with a diameter greater than the first opening. A layer of doped polysilicon is deposited on the bottom and the sidewall of the second opening to form a bottom electrode of a capacitor. Finally, a dielectric layer and a top electrode on the bottom electrode are sequentially formed to complete the manufacturing process of a capacitor.

The node plug and the bottom electrode are conventionally formed by defining the second and the third insulation layers to form the first and the second openings, followed by a deposition of doped polysilicon. The conventional manufacturing method of a capacitor involves multiple steps and is complicated.

SUMMARY OF THE INVENTION

This invention provides a fabrication method of a capacitor of a DRAM, and is also applicable for the manufacturing of other semiconductor devices. The current manufacturing method of a DRAM capacitor comprises the following steps. A substrate comprises a transistor consisting of a gate and source/drain regions, and a planarized first insulation layer on the substrate. The first insulation layer comprises a node contact plug, which is electrically connected to one of the source/drain regions on the side of the gate. A second insulation layer is further formed on the substrate and then defined to form a first opening, exposing the top surface of the node contact plug. After which, the first opening is filled with a fluid precursor to form a sacrificial plug. A portion of the second insulation layer surrounding the sacrificial plug is removed to form a second opening. The bottom of the second opening retains a certain thickness of the second insulation layer. After the removal of the sacrificial plug, a node plug and a first electrode are formed simultaneously in the first opening and on the inner surface of the second opening. Consequently, a dielectric layer is formed on the surface of the first electrode, while a second electrode is formed on the dielectric layer.

According to the current invention, the first electrode and the node plug are formed simultaneously. By using an organic anti-reflecting coating material as the fluid precursor, the sacrificial plug is formed and the bottom anti-reflection layer of the second insulation layer is defined simultaneously. This invention thus comprises at least the advantages of simplifying the manufacturing steps and increasing the productivity.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 1A to 1D are cross sectional views of a DRAM capacitor showing the manufacturing process of DRAM capacitor according to the preferred embodiment of the present invention.

Figure 1A:
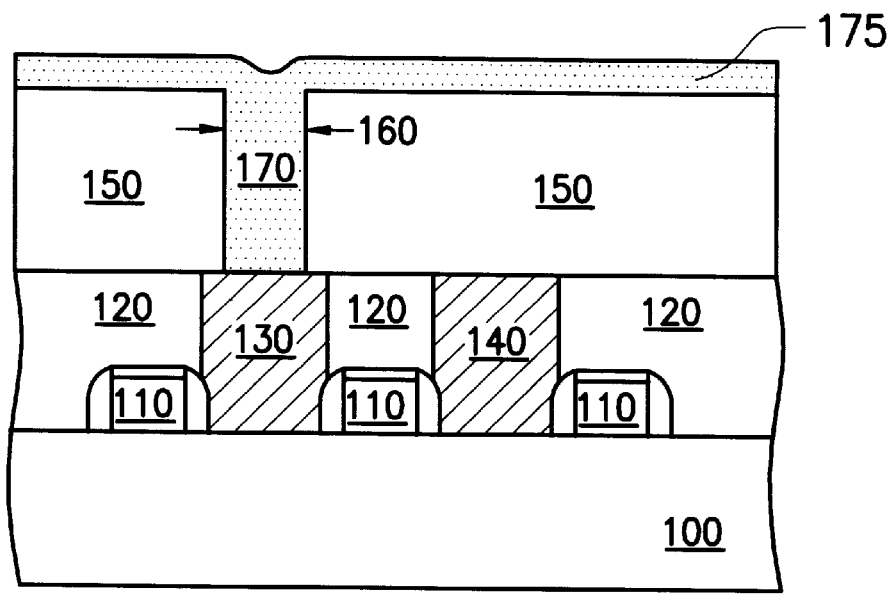
FIGS. 1A to 1D are cross sectional views of a DRAM capacitor showing the manufacturing process of a DRAM capacitor according to the present invention.

Referring to FIG. 1A, the substrate 100 comprises some transistors consisting of gates 110 and source/drain regions, above which is a layer of planarized first insulation layer 120. The first insulation layer 120 comprises a node contact plug 130 and a bit line 140, wherein the node contact plug 130 is electrically connected to one of the dource/drain regions. The materials used for the gates 110 include doped polysilicon or polycide; the materials used for the first insulation layer 120 include silicon oxide; and the materials used for the node contact plug 130 and the bit line 140 include doped polysilicon.

A second insulation layer 150 is formed on the substrate 100. The second insulation layer 150 is further defined to from an opening 160, exposing the top surface of the node contact plug 130. The second insulation layer 150, for example a silicon oxide, is formed by methods including chemical vapor deposition.

Thereafter, the first opening 160 is filled with a fluid precursor, followed by a curing process to form a sacrificial plug 170. The fluid precursor includes an organic anti-reflecting coating material. Using an organic anti-reflection coating material to form the sacrificial plug 170, an anti-reflection layer 175 can also be formed simultaneously on the top of the second insulation layer 150 to facilitate the following photolithography process.

Figure 1B:
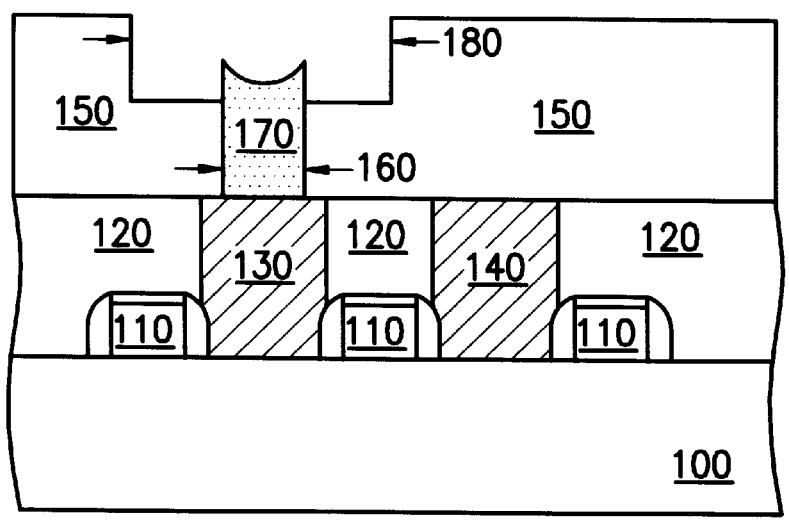

As shown in FIG. 1B, the second insulation layer 150 is patterned and a part of the second insulating layer 150 surrounding the sacrificial plug 170 is removed to form a second opening 180, which is shallower the first opening 160, by using a time mode control. The bottom of the second opening 180 retains a certain thickness of the second insulation layer 150. The etching rate for the sacrificial plug 170 is slower than that of the second insulation layer 150 such that an adequate thickness of the sacrificial plug 170 is remained in the first opening 160 after the second opening 180 is formed. Therefore, the node contact plug 130 located underneath is protected by the sacrificial plug 170 during the formation of the second opening 180.

Figure 1C:
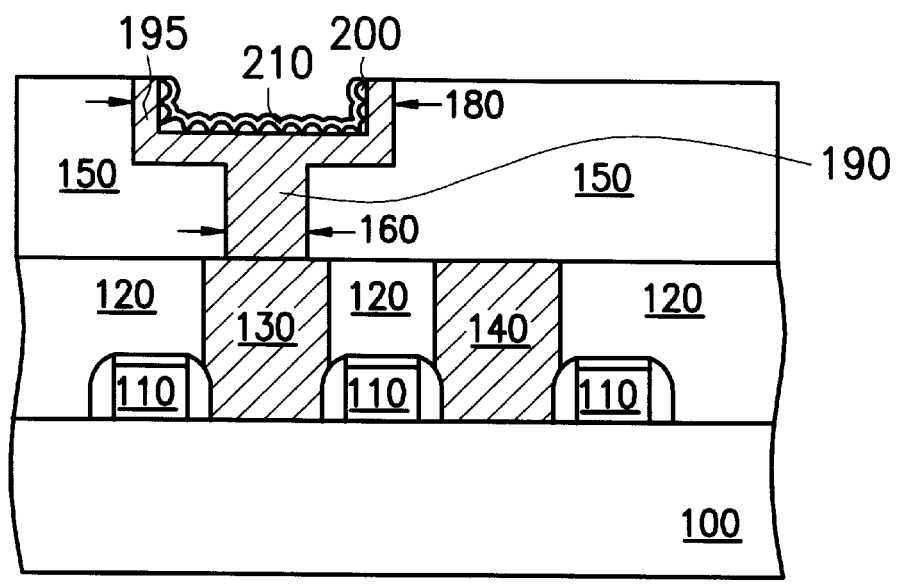

According to FIG. 1C, the remaining sacrificial plug 170 is removed, and the first opening 160 is then filled with a conductive material, such as doped polysilicon. This conductive material also covers the bottom and the sidewalls of the second opening 180, forming respectively a node plug 190 and a first electrode 195, which is a bottom electrode of the capacitor to be formed. Furthermore, a layer of hemispherical silicon grains 200 can be formed on the surface of the first electrode 195 to increase the top surface area. Methods to form the node plug 190 and the first electrode 195 include a deposition of a conductive layer of a thickness enough to totally fill the first opening 160, followed by conducting a chemical mechanical polish method to remove the conductive material on the second insulation layer 150. Thereafter, a dielectric layer 210 is formed, for example a dielectric layer with a silicon oxide-silicon nitride-silicon oxide (ONO) structure.

Figure 1D:
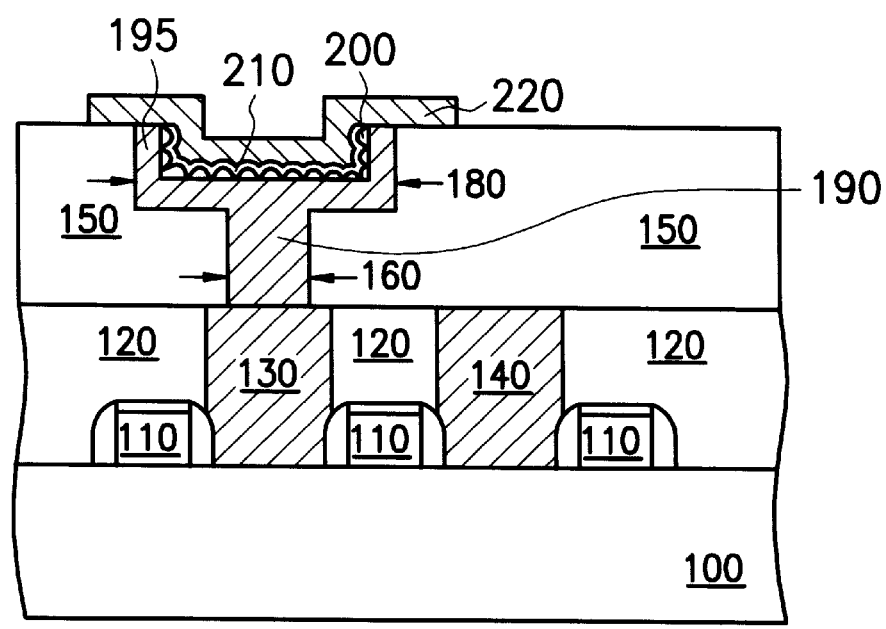

As illustrated in FIG. 1D, a second electrode 220 is formed on the dielectric layer 210. The second electrode 220, for example a doped polysilicon, is formed by methods including a topographic deposition of a conductive layer by a chemical vapor deposition method, followed by patterning the conductive layer to form a second electrode 220 as a top electrode of the capacitor.

According to the preferred embodiment of the current invention, by taking an advantage of the fluidity of a fluid precursor, the first opening 160 in the second insulation layer is filled with the precursor. Therefore, the surfaces of the devices underneath the first opening is protected by the sacrificial plug 170 during the process of removing a portion of the second isolation layer to form the second opening 180. By directly using a dual damascene method, the node plug 190 and the bottom electrode 195 are produced simultaneously, and electrically connected to each other. Furthermore, by using an organic anti-reflection material as the fluid precursor, the formation of the sacrificial plug 170 and the bottom anti-reflection layer for the defining of the second insulation layer can be achieved simultaneously. This invention comprises at least the advantages of simplifying the processing steps, lowering the cost and increasing the productivity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method of a capacitor, wherein the fabrication method is applicable for a substrate comprising at least a transistor having a gate and a plurality of source/drain regions, a planarized first insulation layer on the transistor and on the substrate, and a node contact plug in the first insulation layer which is electrically connected to one of the source/drain, the fabrication method comprising the steps of:

forming an insulation layer of a thickness directly on the first insulation layer and the node contact plug;

defining the insulation layer to form a first opening to expose the node contact plug;

filling the first opening with an organic anti-reflection coating material to form a sacrificial plug in the first opening;

removing a portion of the insulation layer surrounding the sacrificial plug to form a second opening of a depth, wherein the depth of the second opening is less than the thickness of the insulation layer and the node contact plug is not exposed by the second opening;

removing the sacrificial plug to expose the node contact plug;

forming a node plug in the first opening and a first electrode on a bottom and a sidewall of the second opening simultaneously;

forming a dielectric layer on an exposed surface of the first electrode; and forming a second electrode on the dielectric layer.

2. The fabrication method of a capacitor according to claim 1, wherein the etching rate of the sacrificial plug is slower than that of the insulation layer in forming the second opening, so that after formation of the second opening a top surface of the sacrificial plug is higher than a bottom surface of the second opening.

3. The fabrication method of a capacitor according to claim 1, wherein the first electrode includes doped polysilicon deposited by chemical vapor deposition.

4. The fabrication method of a capacitor according to claim 3, wherein the step of forming a node plug in the first opening and a first electrode on a bottom and a sidewall of the second opening simultaneously further includes forming a plurality of hemispherical silicon grains on the first electrode.

5. A fabrication method of a bottom electrode of a capacitor, wherein the fabrication method is applicable for a substrate comprising at least one transistor having a gate and a plurality of source/drain regions, and a planarized insulation layer on the substrate and the transistor, the method comprising the steps of:

defining the insulation layer to form a first opening to expose one of the source/drain regions;

forming a sacrificial plug with an organic anti-reflection coating material in the first opening;

removing a portion of the insulation layer surrounding the sacrificial plug to form a second opening, and retaining a certain thickness of the insulation layer at the bottom of the second opening, wherein a top surface of remaining sacrificial plug is higher than a bottom surface of the second opening;

removing the sacrificial plug; and depositing a conductive material to form a node contact plug in the first opening, and a bottom electrode on the bottom and a sidewall of the second opening.

6. The fabrication method of a bottom electrode of a capacitor according to claim 5, wherein the etching rate for the scarified plug is slower than that of the insulation layer in the process of forming the second opening.

\* \* \* \* \*